United States Patent
Jenkins

[11] Patent Number: 5,890,912
[45] Date of Patent: *Apr. 6, 1999

[54] CONTACT TERMINAL WITH LINEAR CONTACT REGION

[75] Inventor: Charles A. Jenkins, Cookeville, Tenn.

[73] Assignee: Cooper Automotive Products, Inc., Houston, Tex.

[*] Notice: This patent issued on a continued prosecution application filed under 37 CFR 1.53(d), and is subject to the twenty year patent term provisions of 35 U.S.C. 154(a)(2).

[21] Appl. No.: 712,497

[22] Filed: Sep. 11, 1996

[51] Int. Cl.$^6$ ........................................ H01R 9/09
[52] U.S. Cl. ........................... 439/57; 439/862; 439/547
[58] Field of Search ................. 439/57, 56, 36, 439/547, 336, 356, 360, 340, 862, 58, 558, 602, 619, 699.1, 699.2

[56] References Cited

U.S. PATENT DOCUMENTS

| | | | |
|---|---|---|---|
| 2,549,134 | 4/1951 | Shaback | 439/336 |
| 3,256,507 | 6/1966 | Ackerman | 439/619 |
| 3,344,388 | 9/1967 | Parker et al. | 439/57 |
| 3,859,554 | 1/1975 | Preziosi et al. | 439/57 |
| 4,439,000 | 3/1984 | Kaufman et al. | 439/862 |
| 4,593,958 | 6/1986 | Baba | 439/547 |
| 4,947,082 | 8/1990 | French | 439/602 |
| 5,087,213 | 2/1992 | Drapcho et al. | 439/336 |
| 5,350,322 | 9/1994 | Kondo | 439/862 |
| 5,356,297 | 10/1994 | Haskins | 439/56 |

FOREIGN PATENT DOCUMENTS

| | | | |
|---|---|---|---|
| 2618630 | 1/1989 | France | 439/56 |
| 1046859 | 10/1966 | United Kingdom | 439/558 |

OTHER PUBLICATIONS

Drawing specification of PC194 contact terminal 171095, Cooper Automotive/Wagner Lighting Products, Mar. 19, 1994.

*Primary Examiner*—Gary Paumen
*Assistant Examiner*—Tho D. Ta
*Attorney, Agent, or Firm*—Fish & Richardson PC

[57] ABSTRACT

An electrical contact terminal made from electrically conductive material includes a surface having a contact tab. The contact tab has a linear contact region for mechanically contacting a contact surface. An embodiment of the contact terminal may have a contact tab that includes a sector of a cylinder and provides a substantially linear contact region when abutted to a contact surface. The contact terminal may include a locking tab for attaching the electrical contact terminal to a base.

14 Claims, 7 Drawing Sheets

CONTACT TERMINAL WITH LINEAR CONTACT REGION

BACKGROUND OF THE INVENTION

The invention relates to a contact terminal of a lamp assembly. A contact terminal provides electrical continuity between a lamp assembly and a solder track on a printed circuit board or other fixture into which the lamp assembly is installed. Contact terminals having hemispherical shapes are known.

SUMMARY OF THE INVENTION

The invention provides a contact terminal that is cylindrical in shape and has a linear contact region that perpendicularly intersects a solder track on a printed circuit board. Relative to hemispherical terminals, which have a single point of contact, the linear contact region of the cylindrical terminal greatly improves the likelihood that the contact terminal will form a stable electrical connection with the solder track. This, in turn, reduces the accuracy with which the lamp assembly installation hole and solder tracks must be positioned.

In one aspect, generally, the invention features an electrical contact terminal made from electrically conductive material. The terminal includes a surface having a contact tab. The contact tab has a linear contact region for mechanically contacting a contact surface.

Embodiments of the invention may include one or more of the following features. The contact tab may be in the shape of a plane that is bent in a single dimension. For example, the contact tab may be a sector of a cylinder.

The electrical contact terminal may include a body having a first surface and a perpendicular second surface, and may be made from a single piece of electrically conductive material. The contact tab may include a first end connected to the first surface and an unattached, free end that permits displacement of the contact tab when the contact tab is abutted to a contact surface. The contact tab may extend beyond the first surface. The second surface of the contact terminal may include a locking tab.

The contact terminal may be employed in a lamp assembly that also includes a base and a light bulb installed in the base. The contact terminal may be electrically connected to the light bulb. The contact terminal may be secured in the base by the locking tab.

Other features and advantages of the invention will be apparent from the following detailed description, including the drawings, and from the claims.

DESCRIPTION OF THE PREFERRED EMBODIMENTS

Figure 1:
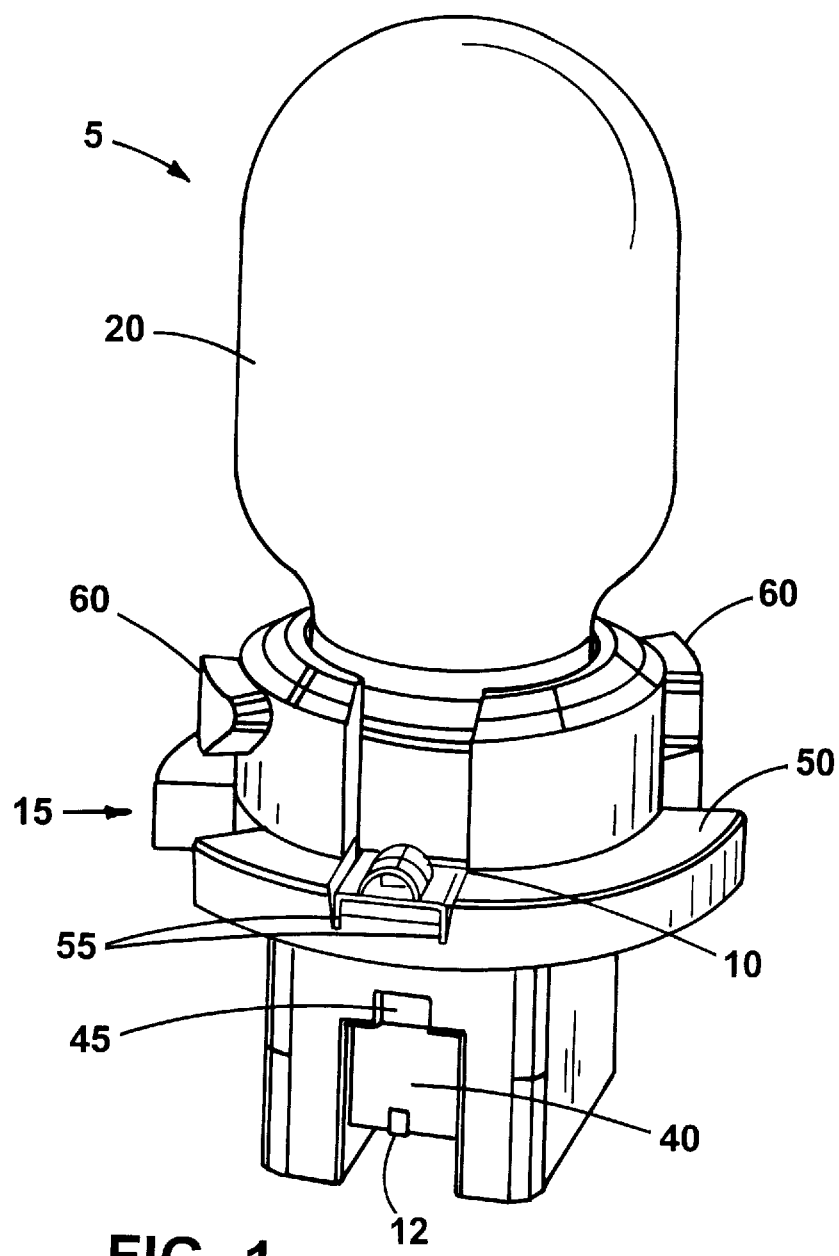
FIG. 1 is a perspective view of a lamp assembly with a cylindrical contact terminal.
Figure 2:
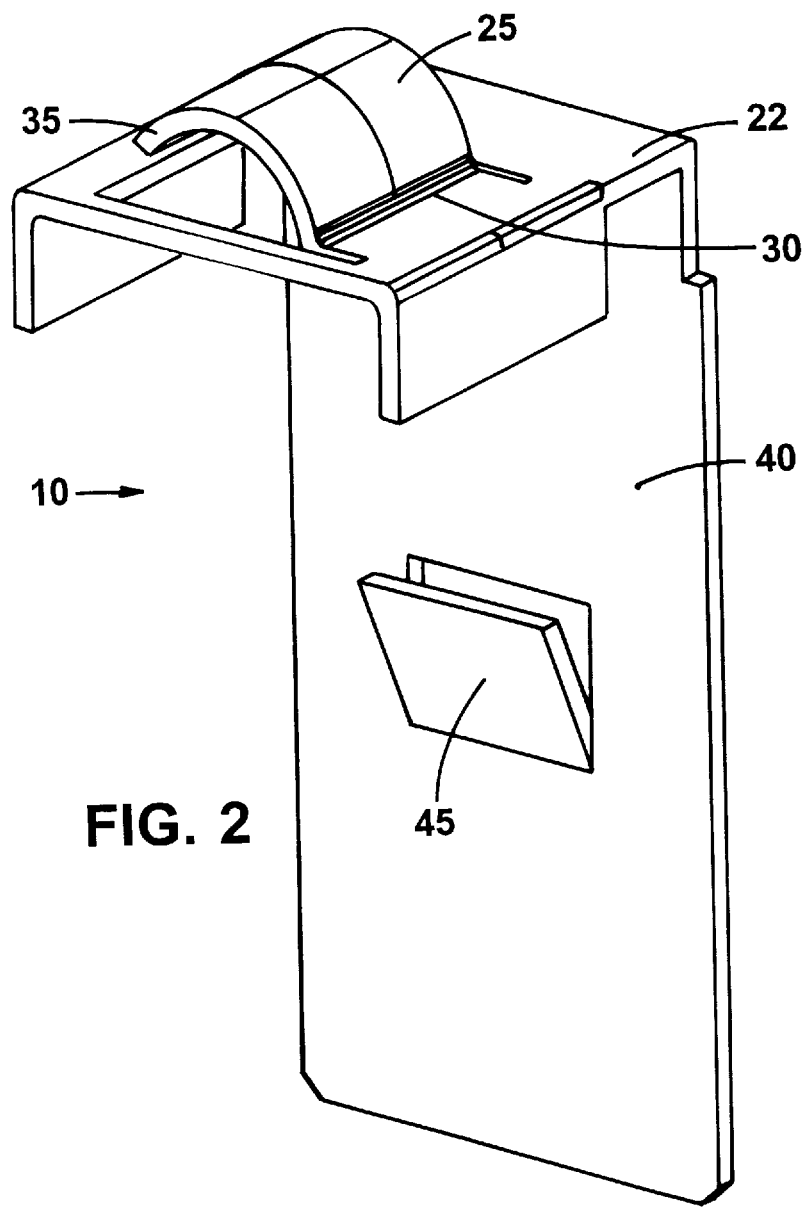
FIG. 2 is a perspective view of the cylindrical contact terminal of FIG. 1.

As shown in FIG. 1, a lamp assembly 5 may include a metal contact terminal 10 secured to a plastic lamp base 15. A bulb 20 is attached to the lamp base. Referring also to FIG. 2, the contact terminal 10 may be fabricated from a single piece of conductive metal. The top 22 of the contact terminal has a contact tab 25 in the shape of a sector of a cylinder. The contact tab includes a fixed end 30 and a free end 35. The fixed end 30 is continuous with the single piece of conductive metal from which the contact terminal is formed. A gap exists between the free end 35 of the contact tab 25 and the top 22 of the contact terminal 10. As discussed below, this gap permits displacement of the contact tab 25 when the contact tab is abutted to a contact surface.

The back 40 of the contact terminal 10 is perpendicular to the top thereof. The back 40 acts as an insertion tab to ease insertion of the contact terminal 10 into the base 15 of the lamp assembly 5. The back 40 of the contact terminal has a locking tab 45 to hold the contact terminal in the base 15.

Referring again to FIG. 1, a contact terminal is inserted into a position on the side of the base 15. A second contact terminal (not shown) is positioned in the same manner on the opposite side of the base 15. The back 40 of the contact terminal 10 and the locking tab 45 are visible from the side of the base 15. The lamp leads 12, which provide an electrical connection to the bulb 20, are connected to the contact terminal, generally by resistance welding.

Figure 3:
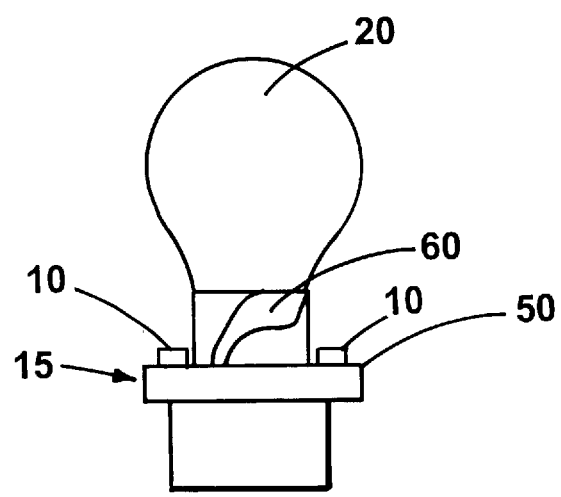
FIG. 3 is a side view of the lamp assembly and cylindrical contact terminal of FIG. 1.

The base 15 has a mounting ledge 50 around its substantially round circumference. The top surface of the ledge 50 abuts the contact surface (not shown) when the lamp assembly is installed in a printed circuit board, as described below. Two tabs 55 folded from the top surface 22 of the contact terminal 10 hold the contact terminal in position with the top surface 22 just below the top surface of the mounting ledge 50. With this positioning, the contact tab 25 on the contact terminal 10 extends slightly above the top surface of the mounting ledge 50. The base 15 also has two locking tabs 60, shown in the side view of the lamp assembly of FIG. 3. These tabs hold the lamp assembly in position in the printed circuit board.

Figure 4:
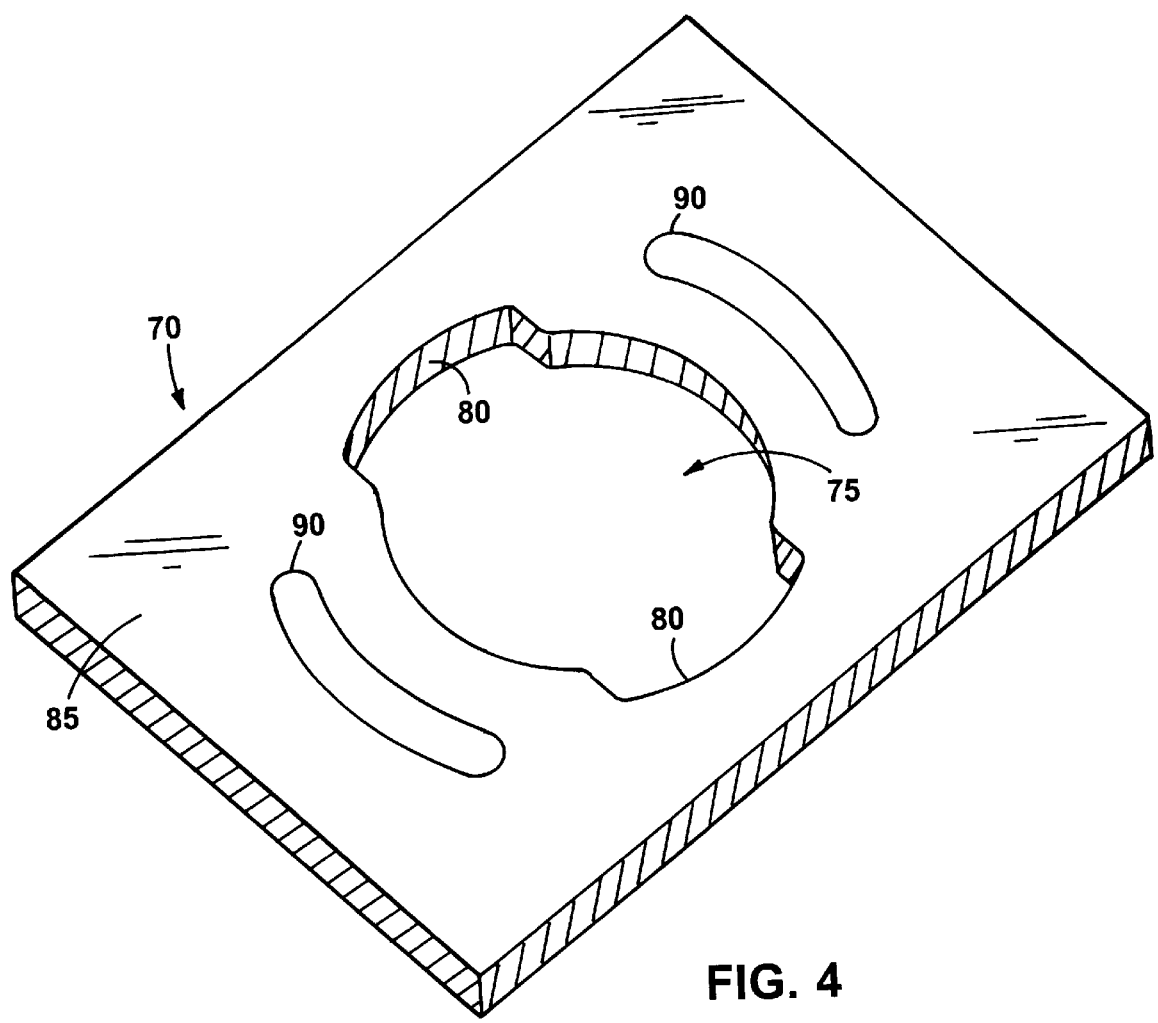
FIG. 4 is a perspective view of a printed circuit board.

FIG. 4 shows a portion of a printed circuit board 70 into which the lamp assembly may be installed. To install the lamp assembly, the assembly is inserted, bulb end first, through the hole 75 in the printed circuit board 70. The locking tabs 60 on the lamp base pass through the slots 80 on opposite sides of the hole 75. The lamp assembly is inserted until the top surface of the mounting ledge 50 of the base 15 is flush with the contact surface 85. The lamp assembly is then rotated so that the tabs 60 move over edges of the slots 80 to hold the lamp assembly in place.

The contact tab 25 of the contact terminal 10 abuts the contact surface 85 when the lamp assembly is installed. More specifically, the contact tab 25 is coincident with a solder track 90 on the contact surface 85. The abutment of the contact tab 25 to the solder track 90 provides a path through which electrical current may flow.

The abutment of the contact tab 25 to the contact surface 85 can be represented geometrically as the intersection of a cylinder and a plane. The intersection of these geometric shapes is a line.

Figure 5:
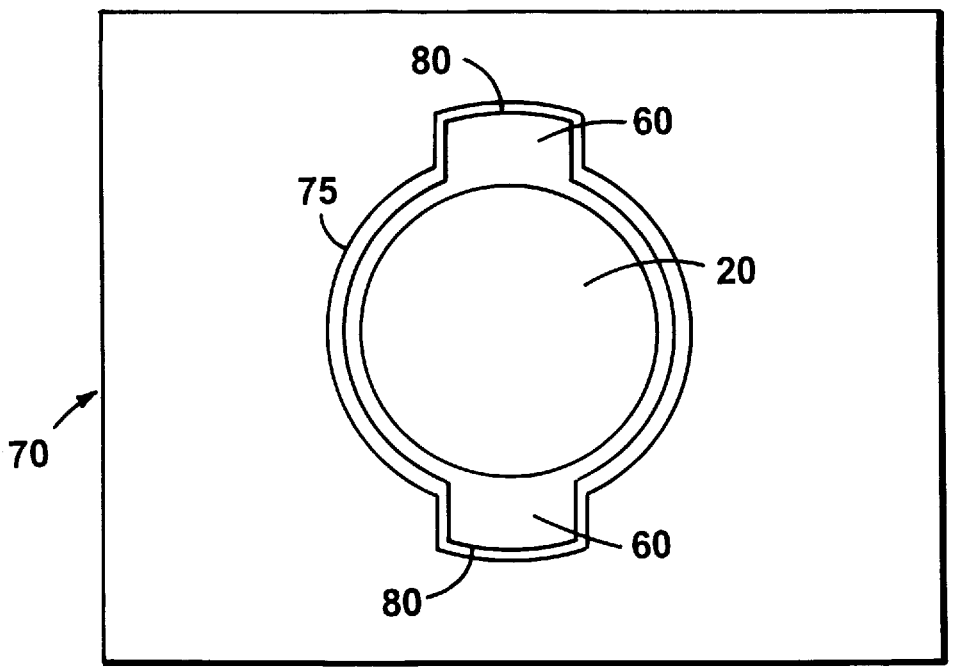
FIGS. 5 and 6 are top views of a printed circuit board and a lamp assembly.
Figure 6:
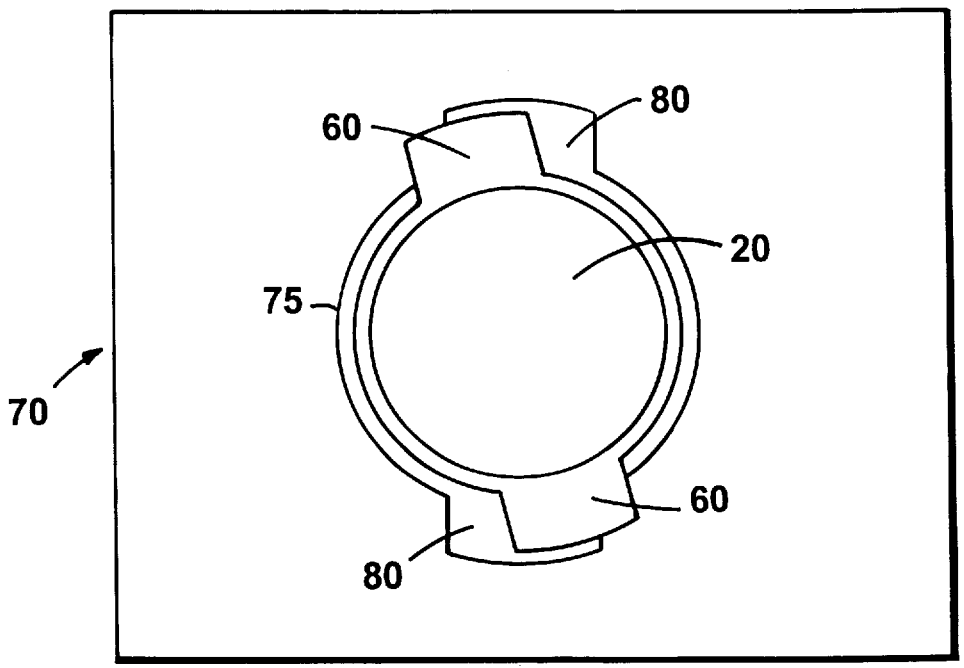

FIG. 5 shows a top view of the lamp assembly inserted into the printed circuit board 70. The locking tabs 60 are coincident with the slots 80 in the printed circuit board. The lamp assembly is then rotated in the clockwise direction so that the locking tabs 60 of the base 15 grip the printed circuit board 70, holding the lamp assembly firmly in place, as shown in FIG. 6.

Figure 7:
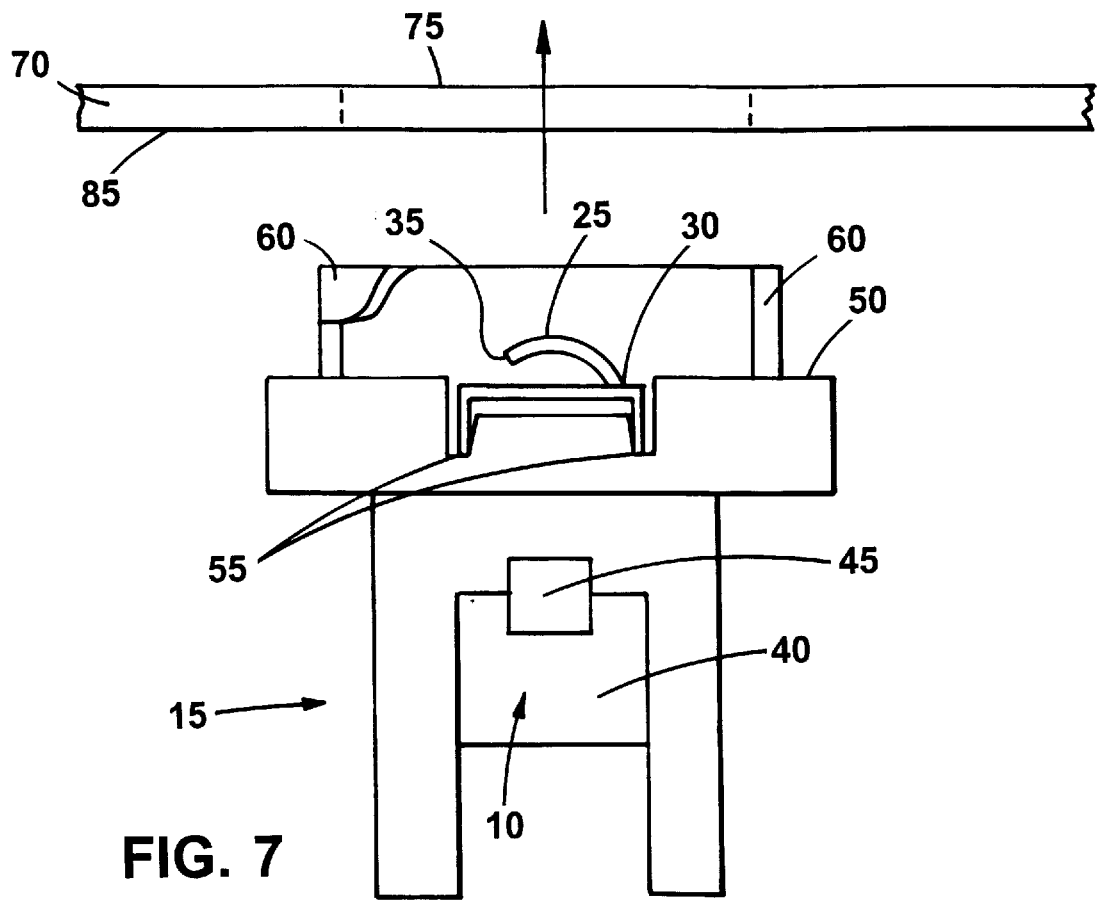
FIGS. 7 and 8 are side views of a lamp assembly (without a bulb) and a printed circuit board.
Figure 8:
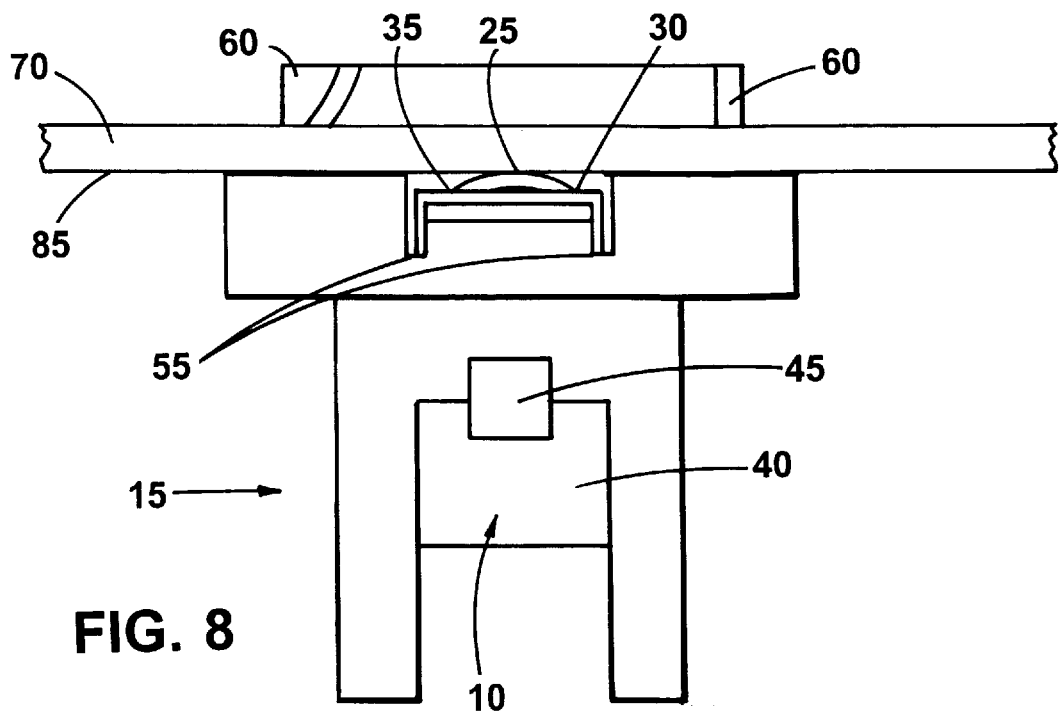

FIG. 7 shows the contact terminal 10 in the lamp base 15 prior to insertion through the hole 75 in the printed circuit board 70. The insertion and rotation of the lamp assembly will result in the contact tab 25 being displaced, as it extends slightly above the top surface of the mounting ledge 50. FIG. 8 shows the contact terminal 10 after it has been inserted into the printed circuit board 70 and rotated to lock it in place. The bending of the contact tab 25 results in a constant force which holds the contact tab 25 firmly against the contact surface 85.

Figure 9:
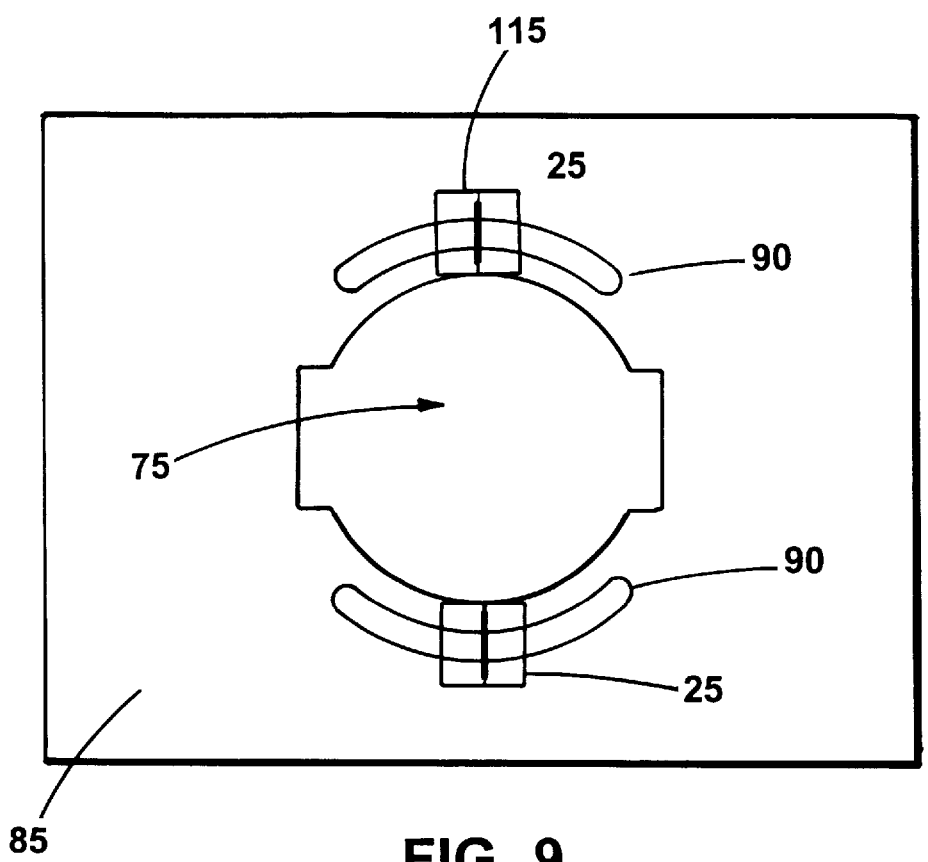
FIG. 9 is a plan view illustrating contact regions between cylindrical contact terminals and solder tracks on a printed circuit board.

Referring also to FIG. 9, the surface area of physical contact between the contact tab 25 and the contact surface 85 is a linear contact region 115 of narrow width. The width of the linear contact region 115 depends primarily upon the radius of curvature of the cylindrical contact tab 25 and the extent of deformation of the contact tab 25 as it is abutted to the contact surface 85. The linear contact region 115 extends radially from the center of the hole 75 through which the lamp assembly is inserted. This linear contact region 115 is oriented so as to perpendicularly intersect the solder tracks 90 on the contact surface 85, as shown in FIG. 9.

Other embodiments are within the scope of the following claims.

What is claimed is:

1. An electrical contact terminal for a lamp assembly having a lame base, the terminal being made from electrically conductive material and comprising:

a first surface, a second surface adjoining the first surface, the second surface being perpendicular to the first surface and configured for insertion into the lamp base, a third surface extending from the first surface, the third surface being perpendicular to the first and second surfaces and configured to support the first surface above a rim of the lamp base, and a contact tab having a linear contact region for mechanically contacting a contact surface, wherein the contact tab extends from an interior region of the first surface in a first direction and is in the shape of a plane that is bent around a single axis, and the third surface extends from the first surface in a second direction that is opposite to the first direction.

2. The electrical contact terminal of claim 1, wherein the contact tab comprises a sector of a cylinder.

3. The electrical contact terminal of claim 1, wherein the electrical contact terminal is made from a single piece of electrically conductive material.

4. The electrical contact terminal of claim 1, wherein the second surface includes a locking tab.

5. A lamp assembly comprising a lamp base, a light bulb installed in the lamp base, and an electrical contact terminal, the terminal being made from electrically conductive material and comprising:

a first surface, a second surface adjoining the first surface, the second surface being perpendicular to the first surface and configured for insertion into the lamp base, a third surface extending from the first surface, the third surface being perpendicular to the first and second surfaces and configured to support the first surface above a rim of the lamp base, and a contact tab having a linear contact region for mechanically contacting a contact surface, wherein the contact tab extends from an interior region of the first surface and is in the share of a plane that is bent around a single axis, the third surface extends from the first surface in a direction away from the contact tab, and the contact terminal is electrically connected to the light bulb at an end of the second surface opposite the first surface.

6. A lamp assembly, comprising:

a base having a socket configured to receive a light bulb and a circumferential rim around the socket, and an electrical contact terminal installed in the base, the contact terminal comprising:

a first surface disposed above the rim, a second surface that adjoins and is perpendicular to the first surface and is positioned in the base, a third surface adjoining the first surface and perpendicular to the first surface, the third surface supporting the first surface above the rim, and a contact tab that extends from an interior region of the first surface and is in the shape of a plane that is bent around a single axis.

7. The lamp assembly of claim 6, wherein the first surface is parallel to the rim.

8. The lamp assembly of claim 6, further comprising a light bulb installed in the socket.

9. The lamp assembly of claim 6, wherein the contact terminal is installed in a notched portion of the rim.

10. A lamp assembly, comprising:

a base having a socket configured to receive a light bulb and a circumferential rim around the socket, and an electrical contact terminal installed in the base, the contact terminal comprising:

a first surface disposed above the rim, a second surface adjoining and perpendicular to the first surface and extending into the base, and a contact tab extending from an interior portion of the first surface and having a linear contact region for contacting a contact surface, wherein the linear contact region extends in a radial direction relative to a center of the base.

11. The lamp assembly of claim 10, wherein the first surface is parallel to the rim.

12. The lamp assembly of claim 10, wherein the contact terminal further comprises a third surface adjoining and perpendicular to the first surface and supporting the first surface above the rim.

13. The lamp assembly of claim 10, further comprising a light bulb installed in the socket.

14. The lamp assembly of claim 10, wherein the contact terminal is installed in a notched portion of the rim.

* * * * *